United States Patent
Ronde et al.

(10) Patent No.: US 10,649,347 B2
(45) Date of Patent: May 12, 2020

(54) LITHOGRAPHIC APPARATUS AND DEVICE MANUFACTURING METHOD

(71) Applicant: ASML Netherlands B.V., Veldhoven (NL)

(72) Inventors: Michael Johannes Christiaan Ronde, Veldhoven (NL); Lucas Kuindersma, Veldhoven (NL); Niels Johannes Maria Bosch, Eindhoven (NL); Hans Butler, Veldhoven (NL); Cornelius Adrianus Lambertus De Hoon, Veldhoven (NL); Marc Wilhelmus Maria Van Der Wijst, Veldhoven (NL); Thijs Verhees, Veldhoven (NL); Sander Kerssemakers, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/219,449

(22) Filed: Dec. 13, 2018

(65) Prior Publication Data
US 2019/0129317 A1  May 2, 2019

Related U.S. Application Data

(63) Continuation-in-part of application No. 15/027,986, filed as application No. PCT/EP2014/072590 on Oct. 22, 2014, now Pat. No. 10,409,175.
(Continued)

(51) Int. Cl.
G03B 27/42 (2006.01)
G03F 7/20 (2006.01)
H01J 37/26 (2006.01)

(52) U.S. Cl.
CPC .......... *G03F 7/70766* (2013.01); *G03F 7/709* (2013.01); *G03F 7/7085* (2013.01);
(Continued)

(58) Field of Classification Search
CPC .. G03F 7/70775; G03F 7/70725; G03F 7/709; G03F 7/7085; G03F 7/70716;
(Continued)

(56) References Cited

U.S. PATENT DOCUMENTS

| | | |
|---|---|---|
| 5,187,519 A | 2/1993 | Takabayashi et al. |
| 8,164,737 B2 | 4/2012 | Butler et al. |

(Continued)

FOREIGN PATENT DOCUMENTS

| | | |
|---|---|---|
| EP | 1 780 772 | 5/2007 |
| JP | 2001-304332 | 10/2001 |

(Continued)

OTHER PUBLICATIONS

U.S. Final Office Action issued in corresponding U.S. Appl. No. 15/027,986, dated Jan. 31, 2019.
(Continued)

*Primary Examiner* — Mesfin T Asfaw
(74) *Attorney, Agent, or Firm* — Pillsbury Winthrop Shaw Pittman LLP

(57) ABSTRACT

An apparatus having: a system configured to measure an object; a base structure; an object support constructed to hold the object, the object support movably supported on the base structure; a balance mass configured to absorb a reaction force arising from movement of the object support; an actuator connected to the balance mass and the base structure, the actuator configured to apply a force to the balance mass and the base structure; a sensor configured to produce a signal for a measured characteristic of the base structure corresponding to a disturbance, or its effect, acting on the base structure; and a control system configured to determine, based on at least the signal for the measured characteristic of the base structure, a signal for the actuator to apply a force to the base structure and/or the balance mass.

20 Claims, 9 Drawing Sheets

Related U.S. Application Data

(60) Provisional application No. 61/897,072, filed on Oct. 29, 2013.

(52) U.S. Cl.
CPC ...... *G03F 7/70775* (2013.01); *G03F 7/70833* (2013.01); *H01J 37/26* (2013.01)

(58) Field of Classification Search
CPC ............ G03F 7/70975; G03F 7/70758; G03F 7/70833; G03F 7/70516; G03F 7/707; G03F 7/70766; G03F 7/70825
See application file for complete search history.

(56) References Cited

U.S. PATENT DOCUMENTS

| | | |
|---|---|---|
| 2005/0041233 A1 | 2/2005 | Van Schothorst |
| 2007/0279644 A1 | 12/2007 | Teun Plug et al. |
| 2009/0122284 A1 | 5/2009 | Butler et al. |
| 2009/0153832 A1 | 6/2009 | Tatsuzaki |
| 2009/0262325 A1 | 10/2009 | Butler |
| 2013/0044306 A1 | 2/2013 | Emoto et al. |

FOREIGN PATENT DOCUMENTS

| | | |
|---|---|---|
| JP | 2005-109441 | 4/2005 |
| JP | 2007-120646 | 5/2007 |
| JP | 2009-105398 | 5/2009 |
| JP | 2010-080624 | 4/2010 |
| JP | 2011-124292 | 6/2011 |
| JP | 2013-041981 | 2/2013 |

OTHER PUBLICATIONS

International Search Report and Written Opinion dated Dec. 22, 2014 in corresponding International Patent Application No. PCT/EP2014/072590.

Japanese Office Action dated Oct. 31, 2017 in corresponding Japanese Patent Application No. 2016-527191.

Japanese Office Action dated Mar. 7, 2017 in corresponding Japanese Patent Application No. 2016-527191.

LITHOGRAPHIC APPARATUS AND DEVICE MANUFACTURING METHOD

This application is a continuation-in-part patent application of U.S. patent application Ser. No. 15/027,986, filed Apr. 7, 2016, which is the U.S. national phase entry of PCT patent application no. PCT/EP2014/072590, filed Oct. 22, 2014, which claims the benefit of priority of U.S. provisional application No. 61/897,072, filed Oct. 29, 2013, each of which is incorporated herein in its entirety by reference.

FIELD

The present description relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of devices such as integrated circuits (ICs). In such a case, a patterning device, which is alternatively referred to as a mask or a reticle, may be used to generate a pattern (e.g., a circuit pattern) to be formed on an individual layer of the device. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate.

In general, a single substrate will contain a network of adjacent target portions that are successively patterned. Conventional lithographic apparatuses include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology or inspection processes are typically involved in the patterning process.

SUMMARY

Metrology or inspection processes are used at various steps during a patterning process to monitor and control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters/variables of the patterning process such that further substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Errors, such as overlay errors, CD errors, etc., will inevitably be produced in the patterning process. For example, imaging errors may be produced from optical aberration, patterning device heating, patterning device errors, and/or substrate heating and can be characterized in terms of, e.g., overlay errors, CD errors, etc. Additionally or alternatively, errors may be introduced in other parts of the patterning process, such as in etch, development, bake, etc. and similarly can be characterized in terms of, e.g., overlay errors, CD errors, etc. The errors may directly cause a problem in terms of the functional of the device, including failure of the device to function or one or more electrical problems of the functioning device.

As noted above, in patterning processes, it is desirable to frequently make measurements of the structures created, e.g., for process control and verification. One or more parameters of the structures are typically measured or determined, for example the critical dimension of a structure, the overlay error between successive layers formed in or on the substrate, etc. There are various techniques for making measurements of the microscopic structures formed in a patterning process. Various tools for making such measurements are known including, but not limited to, image-based metrology or inspection apparatuses, diffraction-based metrology or inspection apparatuses, scanning electron microscopes (SEMs), etc. A SEM is often used to measure critical dimension (CD) and has a high resolving power (e.g., capable of resolving features of the order of 50 nm, 10 nm or less). SEM images of semiconductor devices are often used in the semiconductor fab to observe what is happening at the device level.

The metrology or inspection information (such as contained in SEM images of device structures) can be used for process modeling, existing model calibration, defect detection, estimation or classification, yield estimation, process control or monitoring, etc. SEM images may be processed to extract contours that describe the edges of objects, representing device structures, in the image. These contours are then quantified via metrics, such as CD, at user-defined cut-lines. Thus, typically, the images of device structures are compared and quantified via simplistic metrics, such as an edge-to-edge distance (CD) measured on extracted contours or simple pixel differences between images. These simplistic metrics may not allow for the identification of accurate and descriptive multivariate models and thus, e.g., not allow precise control of yield.

In order to ensure proper creation of devices that are typically manufactured by successive patterning processes (note that, e.g., an IC may comprise up to 30 or more successive layers) and/or accurate measurement, an accurate alignment of an object (such as a substrate) that is physically processed and/or measured should be performed. A significant condition to realize such an accurate alignment is to make sure that a positioning of the object relative to, e.g., a patterning device (or reticle) for lithographic process and/or a measurement beam in a metrology or inspection apparatus, is controlled as accurately as possible. To facilitate this, vibrations of the structures supporting the substrate and/or equipment used to process the substrate (e.g., a patterning device, a projection system and/an illumination system of a lithographic apparatus and/or an optical system to provide a measurement beam) should be avoided or suppressed.

In the lithographic apparatus example, during a typical exposure cycle, both the substrate and the patterning device undergo significant accelerations. Similarly, to measure in a metrology apparatus or inspect in an inspection apparatus, multiple locations on an object, the object (such as semiconductor substrate) undergoes significant accelerations to put different locations on the object in the field of view of the metrology or inspection apparatus. In order to generate such accelerations, powerful positioning devices, typically including a plurality of electromagnetic actuators, linear or planar motors, are applied to exert the appropriate forces to the support structures (e.g., of the substrate, the patterning device, etc.). As will be understood by the skilled person, when acceleration or deceleration forces are applied to support structures (such as in a lithographic apparatus or metrology or inspection apparatus), equal and opposite reaction forces are generated as well. When such reaction forces would be exerted on a stationary frame of the relevant apparatus, significant vibrations would be generated throughout the apparatus, thus adversely affecting the accuracy of the applicable process (e.g., measurement, exposure, etc. process). In order to avoid the generation of such vibrations, a balance mass arrangement is typically applied, whereby the reaction forces are not applied to a stationary frame but to a counter mass which is configured to displace in a substantially frictionless manner relative to the stationary frame or frames of the apparatus. By using such a balance mass arrangement, the direct application of significant reaction forces on the apparatus can be avoided. However, such a balance mass arrangement may be the cause of vibrations (e.g., through torque components) on a stationary frame and structure of the apparatus. For example, in the case of a lithographic apparatus or metrology or inspection apparatus, an illuminator or illuminator module of the apparatus may be susceptible to such torque components, and may thus suffer from vibrations caused by such torque components. As a result, the illuminator or illuminator module may displace relative to a patterning device (in a lithographic apparatus), a projection system (in a lithographic or metrology or inspection apparatus) or a substrate (in a lithographic or metrology or inspection apparatus), adversely affecting the applicable process.

It is desirable to provide an apparatus that is less susceptible to vibrations caused, e.g., by a balance mass arrangement and/or other disturbances.

According to an aspect, there is provided a metrology or inspection apparatus comprising: a system configured to measure an object; a base structure; an object support constructed to hold the object, the object support movably supported on the base structure; a balance mass configured to absorb a reaction force arising from movement of the object support; an actuator connected to the balance mass and the base structure, the actuator configured to apply a force to the balance mass and the base structure; a sensor configured to produce a signal for a measured characteristic of the base structure corresponding to a disturbance, or its effect, acting on the base structure; and a control system configured to determine, based on at least the signal for the measured characteristic of the base structure, a signal for the actuator to apply a force to the base structure and/or the balance mass.

According to an aspect, there is provided an apparatus comprising: a system configured to measure an object; a base structure; an object support constructed to hold the object, the object support movably supported on the base structure; a balance mass configured to absorb a reaction force arising from movement of the object support; an actuator connected to the balance mass and the base structure, the actuator configured to apply a force to the balance mass and the base structure; a sensor configured to produce a first signal for a measured physical characteristic of the base structure; a sensor configured to produce a second signal for a measured physical characteristic of the balance mass; and a control system configured to determine, based on the first and second signals, a signal for the actuator to apply a force to the base structure and/or the balance mass.

According to an aspect, there is provided a non-transitory computer readable medium comprising instructions that, when executed by a computer system, are configured to cause the computer system to at least: obtain a signal for a measured characteristic of a base structure of a metrology or inspection apparatus, the measured characteristic corresponding to a disturbance, or its effect, acting on the base structure, wherein the base structure movably supports an object support constructed to hold an object and the metrology or inspection apparatus comprises: a system configured to measure the object, a balance mass configured to absorb a reaction force arising from movement of the object support, and an actuator connected to the balance mass and the base structure and configured to apply a force to the balance mass and the base structure; and determine, based on at least the signal for the measured characteristic of the base structure, a signal for the actuator to apply a force to the base structure and/or the balance mass.

According to an aspect, there is provided a device manufacturing method comprising projecting a patterned beam of radiation onto a substrate, using a lithographic apparatus as described herein.

According to an aspect, there is provided a measurement method comprising taking measurements on an object using a measurement apparatus or an apparatus having a measurement system, as described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
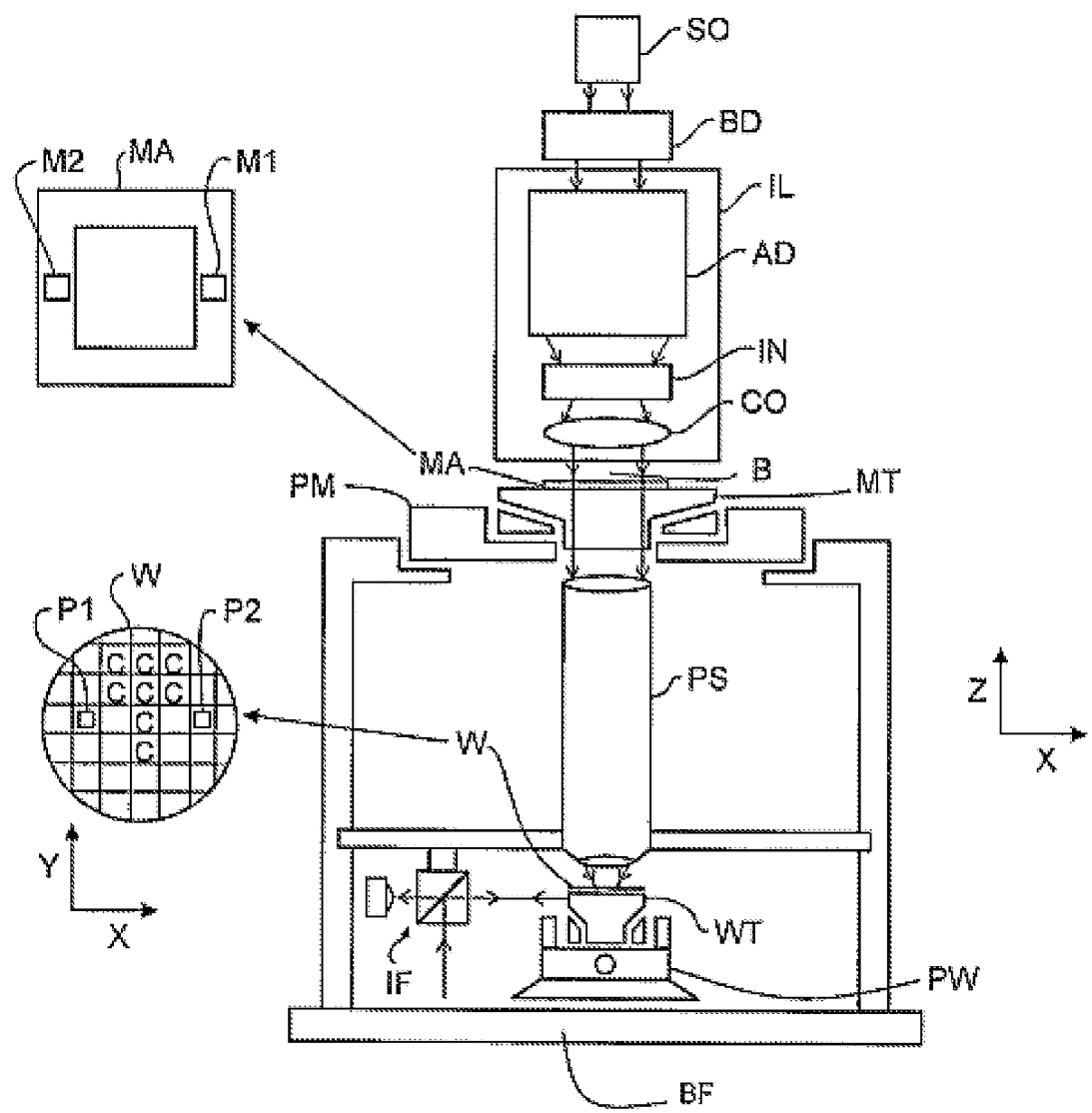
FIG. 1 schematically depicts a lithographic apparatus according to an embodiment of the invention.

FIG. 1 schematically depicts a lithographic apparatus according to an embodiment. The apparatus includes an illumination system (illuminator) IL configured to condition a radiation beam B (e.g. UV radiation or any other suitable radiation), a support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table or substrate support (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or supports (and/or two or more patterning device tables or supports). In such "multiple stage" machines the additional tables or supports may be used in parallel, or preparatory steps may be carried out on one or more tables or supports while one or more other tables or supports are being used for exposure and then their position exchanged.

The lithographic apparatus may be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively)

of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table or support WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table or support WT or "substrate support" may be realized using a long-stroke module and a short-stroke module, which form part of the second positioner PW.

In accordance with an embodiment, the second positioner PW may have a balance mass configuration, as will be explained in more detail below. Such a balance mass configuration may result in torques being exerted on the base frame BF of the apparatus, whereby the torques induce displacements, i.e. vibrations of e.g. the illuminator IL (which is typically mounted to or supported by the base frame) or a so-called reticle handling module, which is applied to transport patterning devices (also referred to as masks or reticles) to and from the support structure (e.g. mask table) MT.

In order to mitigate the effects of such displacements or vibrations, an aspect of the present invention proposes to counteract such displacements by exerting a force, e.g. using an electromagnetic actuator, on the base frame or the affected structure such as the illuminator. In an embodiment, the force is applied to the base frame or the affected structure directly. Alternatively, the force may be applied via an intermediate mass.

When a force is exerted on the base frame or the affected structure, an equal and opposite reaction force is generated as well. In an embodiment, such a reaction force is exerted on a reaction mass. In an embodiment, such a reaction mass can e.g. be freely suspended.

In an embodiment, a balance mass, e.g. a balance mass of a balance mass configuration of the first or second positioning devices PW, PM, may be configured as a reaction mass for the actuator exerting the force on the base frame or the affected structure.

In the case of a stepper (as opposed to a scanner) the support structure (e.g. mask table) MT may be connected to a short-stroke actuator only, or may be fixed.

The patterning device MA and substrate W may be aligned using patterning device alignment marks M1, M2 and substrate alignment marks PI, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure (e.g. mask table) MT and the substrate table or support WT are kept essentially stationary, while an entire pattern imparted to the radiation beam is projected onto a target portion C at one time (i.e. a single static exposure). The substrate table or support WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table or support WT are scanned synchronously while a pattern imparted to the radiation beam is projected onto a target portion C (i.e. a single dynamic exposure). The velocity and direction of the substrate table or support WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table or support WT is moved or scanned while a pattern imparted to the radiation beam is projected onto a target portion C. In this mode, generally a pulsed radiation source is employed and the programmable patterning device is updated as required after each movement of the substrate table or support WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
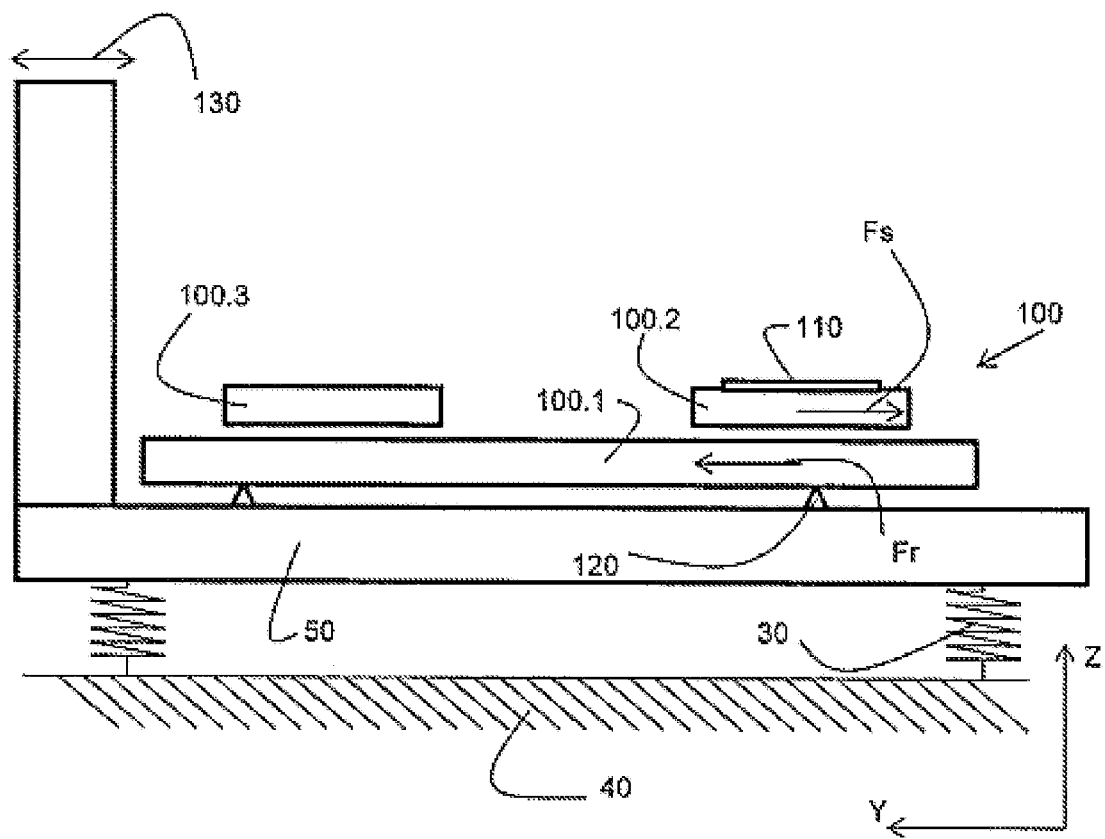
FIG. 2 schematically depicts a positioning device comprising a balance mass configuration as can be applied in a lithographic apparatus according to an embodiment of the invention.

In FIG. 2, a positioning device 100 as can be applied in a lithographic apparatus according to an embodiment of the invention is schematically shown. FIG. 2 schematically shows a base frame 50 that is mounted to a floor 40, reference number 30 referring to the limited stiffness of the base frame itself and the floor to which it is mounted. The positioning device 100 as shown comprises a planar motor, i.e. a two-dimensional electromagnetic motor for positioning a first table 100.2 and a second table 100.3. The electromagnet motor comprises a first member 100.1, e.g. a magnet plate that may comprise a 2D pattern of alternatingly magnetized permanent magnets (not shown) and a second member, e.g. comprising a coil assembly (not shown) which is mounted to the first and second table, for co-operating with the first member 100.1. In an embodiment, both tables may be configured to support a substrate. In an embodiment, one table may be configured as a substrate table, whereas the other table is configured as a measurement or calibration stage. The electromagnet motor is configured to generate forces in a horizontal plane, perpendicular to the Z-direction to displace the substrate 110 or measurement/calibration stage relative to a projection system or measurement system (not shown), by means of a co-operating between the first member and the second member. The coil assembly may comprise a 2D pattern of coils that can be energized. While this embodiment is described in terms of a planar motor, the one or more tables may be moved by one or more linear motors.

In an embodiment, the first member 100.1 of the two-dimensional electromagnetic motor comprises a coil assembly, e.g. comprising a 2D pattern of coils that can be energized. In such embodiment, the second member of the electromagnet motor may comprise a magnet plate that may comprise a 2D pattern of alternatingly magnetized permanent magnets, the magnet plate being mounted to the substrate table(s) or the measurement/calibration stage (100.2, 100.3). In an embodiment, the magnet plate and/or the coil assembly of the two-dimensional electromagnetic motor may be asymmetric with respect to the X- and Y directions, i.e. both directions in the horizontal plane. By doing so, the electromagnetic motor may have different properties, e.g. with respect to available force (and thus acceleration) in the X and Y-directions. By providing the electromagnetic motor with an asymmetric profile in either the magnet pattern or the coil assembly, an increased acceleration in the scanning direction (e.g. the Y-direction) can be obtained, compared to an acceleration in the step direction (e.g. the X-direction). Such asymmetrical properties of the electromagnetic motor may e.g. be obtained by applying asymmetrically shaped magnets (e.g. rectangular shaped instead of square shaped), applying magnets of different size, applying coils of different size in X- and Y-directions, etc.

In the embodiment as shown, the positioning device 100 has a balance mass configuration, wherein the first member 100.1 is free to move in the XY-plane by e.g. application of a gas bearing 120 between the first member 100.1 and the base frame 50. FIG. 2 further illustrates a force Fs generated by the positioning device and the corresponding reaction force Fr occurring on the first member 100.1. By applying the balance mass configuration, the reaction force Fr is not readily applied to the base frame 50. However, because the substrate table 100.2 and the magnet plate 100.1 are not operating in the same horizontal plane, a torque is generated which is exerted on the base frame 50, via the gas bearing 120. In case of the forces as shown, a torque Tx about the X-axis (perpendicular to the YZ-plane) is generated. Such a torque Tx may result in displacements in the Y-direction of structures that are mounted to the base frame 50, as schematically illustrated by the arrow 130. In a similar manner, when a force is exerted in the X-direction on any of the tables 100.2 or 100.3, this force, combined with the corresponding reaction force, a torque Ty is generated about the Y-axis, which can generate displacements of structures on the base frame 50 in the X-direction.

Due to the occurrence of the torque components Tx, Ty, various problems may arise.

Figure 3:
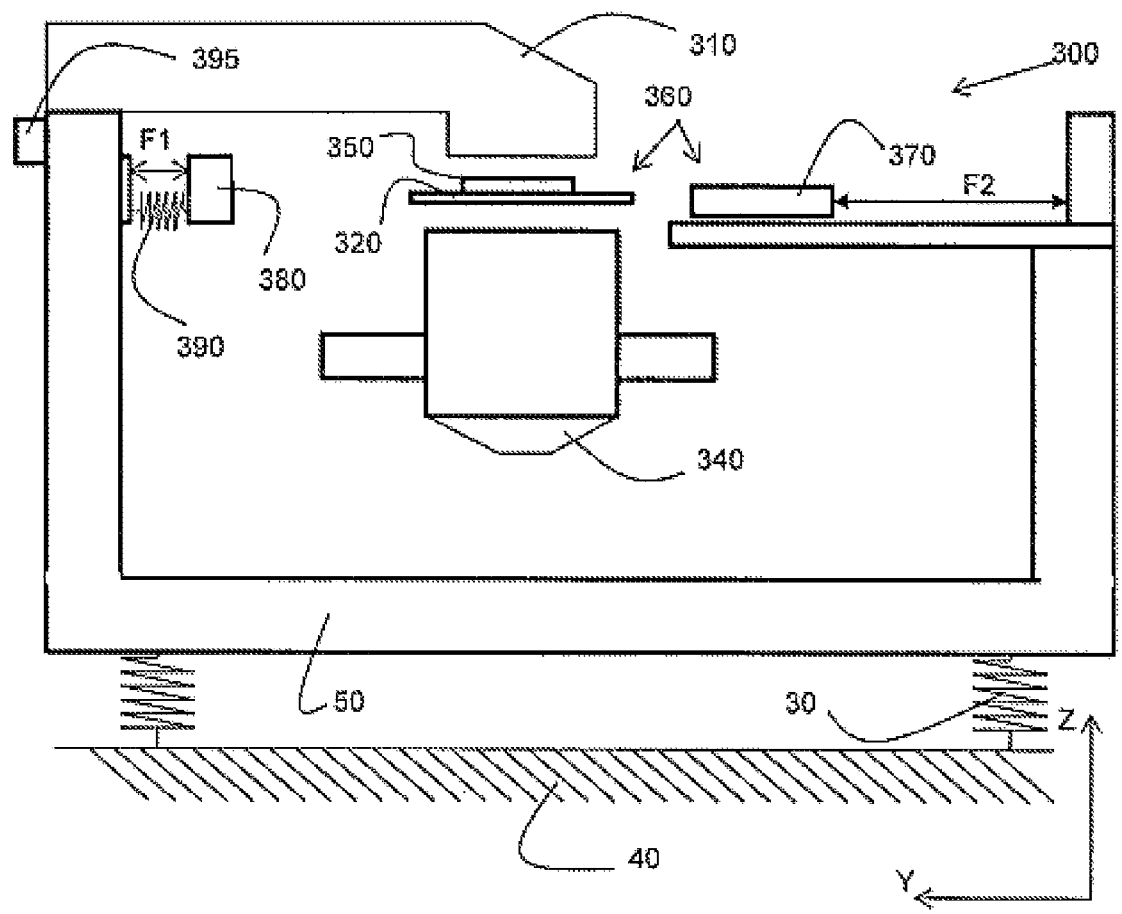
FIG. 3 schematically depicts a lithographic apparatus according to an embodiment of the present invention.

FIG. 3 schematically illustrates the layout of a lithographic apparatus 300, schematically showing an illuminator module 310 and a patterning device support 320. FIG. 3 further shows a projection system 340 which is vibrationally isolated from the base frame (isolation not shown). In order to position the patterning device 350, which is mounted to the support 320, a positioning device 360 is provided, the positioning device having a balance mass configuration, wherein the balance mass 370 is mounted to the base frame 50.

As described above, due to the scanning actions of the substrate support structure, torque components Tx, Ty may occur which result in displacements in both X and Y directions of structures mounted to the base frame 50, such as the illuminator 310 or an interface module (a so-called reticle handler) for transporting patterning devices to and from the patterning device support 320.

In particular, the occurring displacements in the Y-direction (of the illuminator 310) may adversely affect the position of the conditioned radiation beam B as provided to the patterning device. In particular, when a relative displacement occurs between the illuminator 310 and the patterning device during the exposure process, a non-uniformity can occur with respect to the amount of radiation (also referred to as the illumination dosage) as provided by the radiation beam B to the patterning device. Due to the displacement or vibrations of the illuminator, different parts of the patterning device, i.e. different parts of the pattern that needs to be transferred, may receive a different illumination dosage. When different parts of the patterning device receive a different illumination dosage, this will affect the exposure process on the substrate. As an example, the CD (critical dimension) uniformity—a parameter which can be considered a measure for the quality of the exposure process—may be affected adversely.

With respect to the occurring displacements in the X-direction, caused by a torque component Ty, it has been noted that such displacements may adversely affect the accurate positioning of the patterning device 350 onto a patterning device support 320 by an interface module such as a reticle handler.

With respect to the occurring vibrations/displacements, it is further worth noting that the vibrations are caused by the excitation of a few vibration modes, typically between 10 and 30 Hz. It has been observed that the eigen modes or eigen frequencies of the base frame and structures that are mounted to the base frame (such structures e.g. supporting an illumination system or a patterning device exchange module) are typically found in this range. The base frame and structures mounted to the base frame are thus susceptible to torques or forces exerted in that frequency range, e.g. due to a balance mass configuration as described above.

In an embodiment, various options are proposed to mitigate the above described effects.

As a first option, the lithographic apparatus according to an embodiment of the invention comprises a sensing device or sensor configured to sense a vibration or displacement caused by the balance mass configuration and an actuator configured to exert a force, in response to the sensed vibration or displacement, on the illumination system or the base frame in order to at least partly dampen the vibration or displacement. As a sensor, an accelerometer may e.g. be applied. Further, an actuator is provided (e.g. an electromagnetic actuator or a piezo-electric actuator) for exerting a force onto the base frame or the illumination system, in order to dampen the vibration or displacement. In FIG. 3, such an arrangement is schematically shown. At or near the top of the illuminator module 310, an actuator is mounted, the actuator being represented by the force F1. The force F1 may thus be exerted onto the illuminator module 310 or to the structure supporting the module, i.e. the base frame 50. A reaction mass 380 is further provided to receive the reaction force as generated by the actuator. This reaction mass is freely suspended via a suspension 390, which may e.g. include one or more springs. Further, a sensor or sensing device 395 is schematically shown, the sensor e.g. providing a signal representative of the occurring vibrations or displacements which are caused by the torque as exerted on the base frame. Such a representative signal may e.g. be obtained from a velocity or acceleration sensor. The sensor signal may thus be applied to control the actuator.

In an embodiment, several of such arrangements (including actuators, sensors, reaction masses) are mounted at different locations at or near the top of the illuminator or to the supporting structure, thereby enabling, e.g., different vibration modes (e.g. both modes in the X and Y directions) to be dampened.

Because of the comparatively low frequencies of the vibration modes that need to be dampened or counteracted, a comparatively large reaction mass 380 may be required.

In an embodiment, a balance mass of a positioning device of the lithographic apparatus is applied as a reaction mass for the actuator. Typically, both the positioning devices of the patterning device and the substrate (also referred to as the first and second positioners PM and PW in FIG. 1) are provided with a balance mass configuration. When such an arrangement is available, the balance mass of the balance mass configuration may be applied as counter mass or reaction mass.

Such an arrangement is schematically shown in FIG. 3. In FIG. 3, an actuator (represented by the force F2) is schematically shown, the actuator exerting a force F2 onto the base frame, whereas a reaction force is exerted on the balance mass 370 of the positioning device 360 of the patterning device 350. In such an arrangement, there is no need for a separate reaction mass (such as reaction mass 380), since the already present balance mass of the positioning device 360 may be applied.

By exerting a force F2 as indicated, vibrations resulting in displacements in the Y-direction, such displacements e.g. affecting the uniformity of the illumination dosage as provided by the illuminator, can be mitigated. In general, a balance mass configuration of a patterning device is configured to displace in the scanning direction (e.g. the Y-direction). As such, in order to dampen or counteract displacements in non-scanning direction (e.g., the X-direction), an arrangement such as the actuator indicated by the force F1 can be applied.

As an alternative, or in addition, a balance mass of a positioning device for positioning the substrate may equally be applied as a reaction mass. Other balance masses which may be applied in the lithographic apparatus, e.g. a balance mass as applied in a positioning device of a reticle masking unit of the illumination system, may be used as well as a reaction mass.

Figure 4:
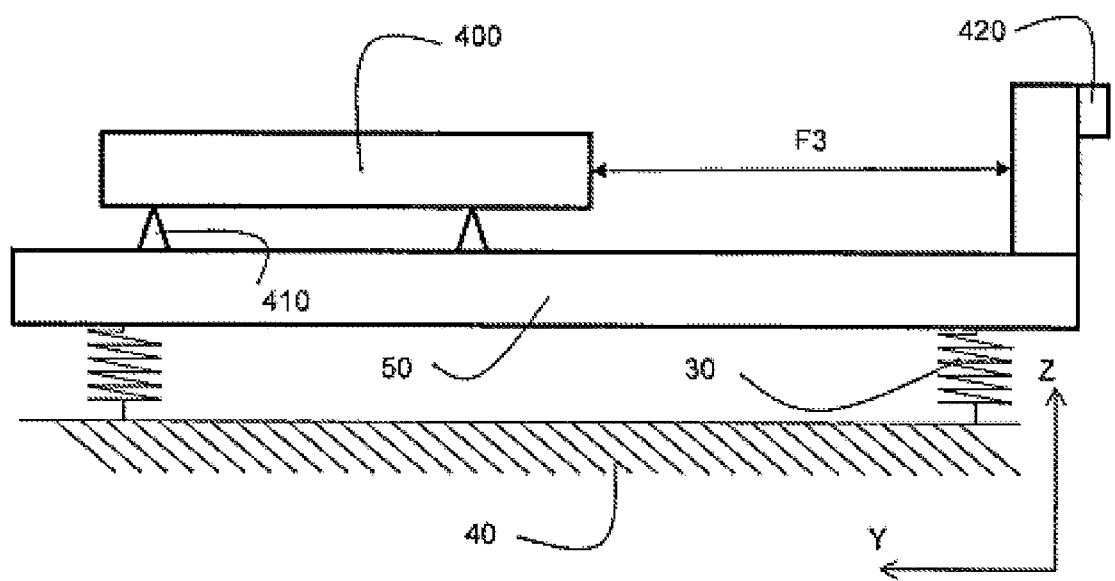
FIG. 4 schematically depicts an actuator—sensor arrangement co-operating with a balance mass.

A detail of such an arrangement is schematically shown in FIG. 4. FIG. 4 schematically shows a base frame 50 which is supported on a ground or floor 40, via connection stiffness 30 indicating the limited stiffness of the base frame and floor. FIG. 4 further shows part of a balance mass 400 (similar to balance mass 100.1 of FIG. 2) which can be part of a balance mass configuration of a positioning device for positioning a substrate, the balance mass 400 being supported by the base frame via a gas bearing 410 or the like (e.g. one or more leaf springs). Indicated by F3, is an actuator force exerted on the base frame 50, whereby a reaction force is exerted on the balance mass 400, the balance mass is thus acting as a reaction mass. The force F3 enables dampening of vibrations or displacements of the base frame 50, that are due to the exertion of the torque components Tx and Ty as described above. A sensing device or sensor 420, e.g., an accelerometer, can be mounted to the base frame to enable control of the force F3.

In the arrangement as shown, a force F3 is exerted in the Y-direction onto the base frame. In a similar manner, a force may be exerted in the X-direction, as in general, a balance mass of a substrate positioning device is substantially free to move in at least both X and Y-directions. In an embodiment, a separate balance mass can be provided if, for example, there are separate actuators causing movement in respectively the X and Y directions.

Figure 5:
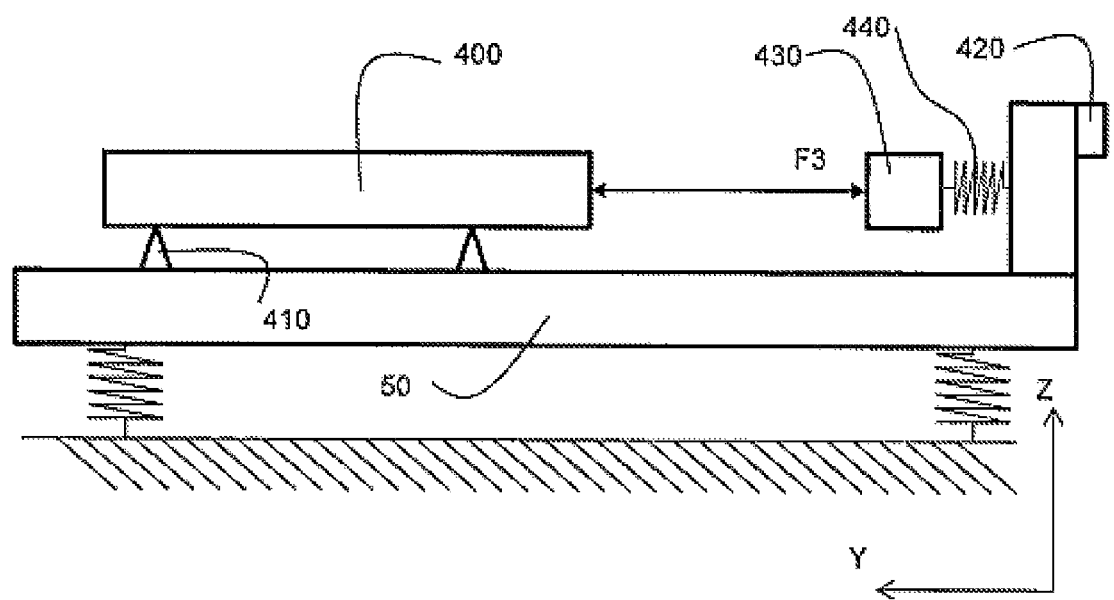
FIG. 5 schematically depicts a further actuator—sensor arrangement co-operating with a balance mass.

In an embodiment, the force as exerted by the actuator (e.g. force F1, F2 or F3) is not directly applied to the base frame or illuminator but indirectly, via an interface mass that is mounted to the base frame or illuminator. This is schematically illustrated in FIG. 5.

Compared to FIG. 4, the actuator force F3 is applied to the base frame 50 via an interface mass 430 that is mounted to the base frame 50 via a damping member, i.e. a compressible or flexible connection 440, e.g. a spring or a rubber or rubber-like component. Applying the force F3 via the interface mass provides a filtering of the applied force.

In a similar manner, an interface mass and damping member may also be applied to exert the forces F1 or F2 onto the illuminator or base frame.

In an embodiment, the apparatus further comprises a control unit or controller configured to receive a sensor signal from the sensor, process the sensor signal to derive an actuator control signal using a control loop and output the actuator control signal to control the actuator. In an embodiment, the controller may include one or more filters to improve the stability of the control loop. In particular, the application of a low-pass filter may enable a too large excitation of the reaction mass to be avoided and application of a high-pass filter may reduce the impact of low frequency noise of the sensing device.

In an embodiment, the sensor, e.g. an accelerometer, is mounted in line with the force as exerted by the actuator. In this respect, when the sensor and the actuator are mounted at a substantial distance apart, this may adversely affect the stability of the control loop of the controller. As such, it is desirable to mount the sensor at or near the actuator. In an embodiment, the sensor and the actuator are co-located. As an example, referring to the embodiment of FIG. 5, the sensor or sensing device 420 could be mounted to the interface mass 430.

In addition to, or as an alternative, a control loop of the controller may include a low pass filter to improve the stability of the control loop.

As noted above, in order that the substrate that is processed (e.g., exposed) by the lithographic apparatus is processed correctly and consistently, it is desirable to inspect a processed substrate to measure one or more properties such as overlay error between subsequent layers, line thickness, critical dimension (CD), etc. If an error is detected, an adjustment may be made to processing of one or more subsequent substrates. This may particularly useful, for example, if the inspection can be done soon and fast enough that another substrate of the same batch is still to be processed. Also, an already processed substrate may be stripped and reworked (to improve yield) or discarded, thereby avoiding performing a pattern transfer on a substrate that is known to be faulty. In a case where only some target portions of a substrate are faulty, a further pattern transfer may be performed only on those target portions which are good. Another possibility is to adapt a setting of a subsequent process step to compensate for the error, e.g. the time of a trim etch step can be adjusted to compensate for substrate-to-substrate CD variation resulting from a lithographic process step.

The measurement can be done on the patterned resist layer immediately after pattern transfer. However, the latent pattern in the resist may have a very low contrast—e.g., there is only a very small difference in refractive index between the part of the resist which has been exposed to radiation and that which has not—and not all inspection apparatuses have sufficient sensitivity to make useful measurements of the latent pattern. Therefore, measurements may be taken after a post-exposure bake step (PEB) which is customarily the first step carried out on a patterned substrate and increases the contrast between, e.g., exposed and unexposed parts of the resist. At this stage, the pattern in the resist may be referred to as semi-latent. It is also possible to make measurements of the developed resist image—at which point, e.g., either the exposed or unexposed parts of the resist have been removed—or after a pattern transfer step such as etching. The latter possibility limits the possibility for rework of a faulty substrate but may still provide useful information, e.g. for the purpose of process control of future substrates to be processed.

Thus, an inspection or metrology apparatus may be used to determine one or more properties of a substrate, and in particular, how one or more properties of different substrates or different layers of the same substrate vary from layer to layer and/or across a substrate. The inspection or metrology apparatus may be integrated into the lithographic apparatus LA or a lithocell (which is a cluster of tools to process a substrate such as a lithographic apparatus, a track, and optionally one or more other apparatuses) or may be a stand-alone device.

In an embodiment, the actuator, balance mass, etc. techniques described herein can be applied to a metrology or inspection apparatus (or other substrate processing tools).

Figure 6:
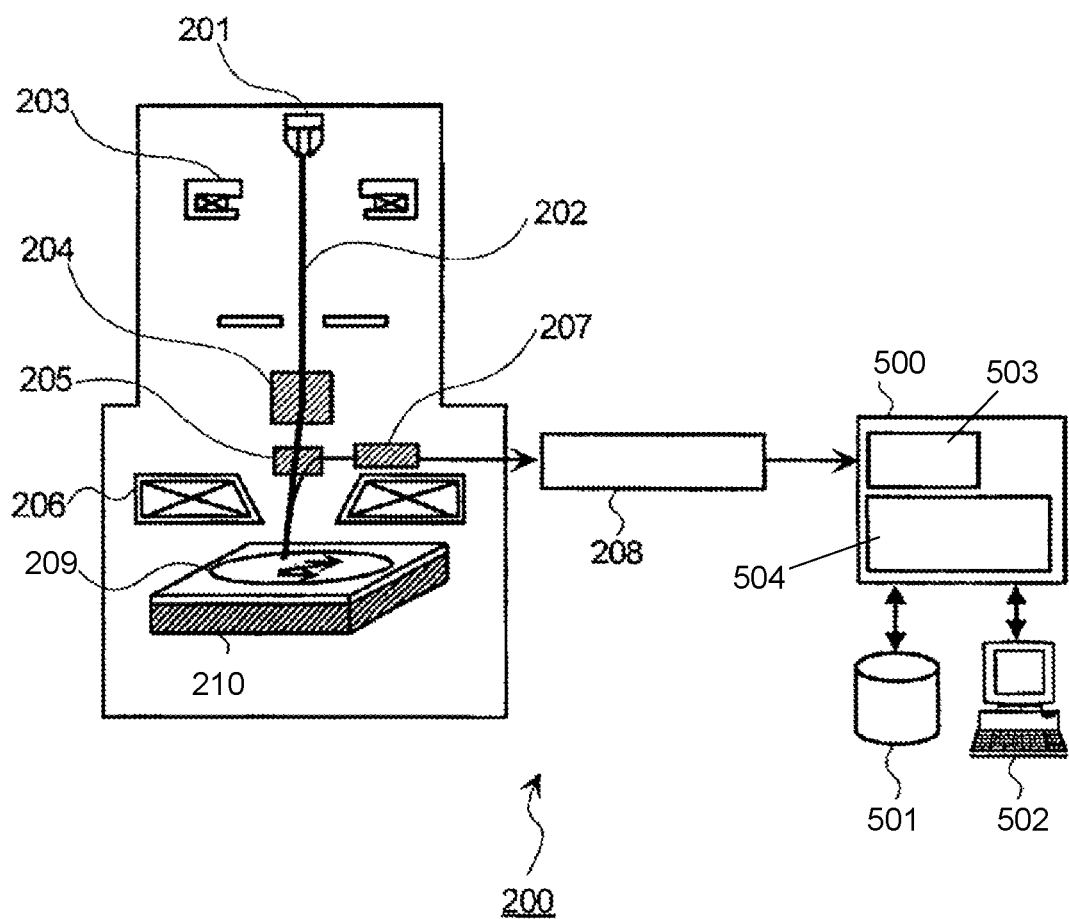
FIG. 6 schematically depicts an embodiment of a metrology or inspection apparatus such as a scanning electron microscope (SEM)

A non-limiting example of such an inspection or metrology apparatus may be an electron microscope-type apparatus that yields an image of a structure (e.g., some or all the structure of a device) exposed or transferred on the substrate. FIG. 6 depicts an embodiment of such an apparatus 200. One or more primary electron beams 202 emitted from an electron source 201 are converged by one or more condenser lenses 203 and then pass through one or more beam deflectors 204, one or more E×B deflectors 205, and one or more objective lenses 206 to irradiate a substrate 209 on a substrate table 210 at a focus. In an embodiment, the table 210, the substrate 209 and the optical components (e.g. lens 203, deflector 204, etc.) all operate in a deep vacuum, inside a vacuum vessel.

While a single electron beam is shown, in an embodiment, multiple beams may be projected on to the substrate in parallel. In such an embodiment, the multiple beams may commonly share an optical component, such as an objective lens 206. The substrate table 210 may be connected to an actuator enable displacement of the substrate 209 so that the electron beam(s) can be incident on different parts of the substrate 209.

When the substrate 209 is irradiated with electron beam(s) 202, secondary electrons are generated from the substrate 209. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 209 by the substrate table 210 in the other of the X or Y direction.

A signal detected by secondary electron detector 207 is converted to a digital signal by an analog/digital (N/D) converter 208, and the digital signal is sent to an image processing system 500. In an embodiment, the image processing system 500 may have memory 503 to store all or part of digital images for processing by a processing unit 504. The processing unit 504 (e.g., specially designed hardware or a combination of hardware and software) is configured to convert or process the digital images into datasets representative of the digital images. Further, image processing system 500 may have a storage medium 501 configured to store the digital images and corresponding datasets in a reference database. A display device 502 may be connected with the image processing system 500, so that an operator can conduct necessary operation of the equipment with the help of a graphical user interface.

The SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. The metrics can be then be used in process control, design, etc.

In an inspection or metrology apparatus (such as a multibeam electron beam inspection apparatus as discussed above), a fast moving stage positions the substrate underneath a (multi-beam) SEM optical column in order to create "pictures" with nanometer accuracy. The SEM optical column can be sensitive to various external dynamic disturbances, such as stage/table movements (such as torques arising therefrom), balance mass movements (such as torques arising therefrom), non-ideal balance mass responses, mismatch between center of gravity, center of mass and/or center of force of two or more bodies, floor (pedestal) vibrations, vacuum pump vibrations, substrate robot handler movements (e.g., movements by a robot that moves the substrate to and from the table), etc. Accordingly, it would be desirable to reduce or minimize the impact of such disturbances.

Figure 7:
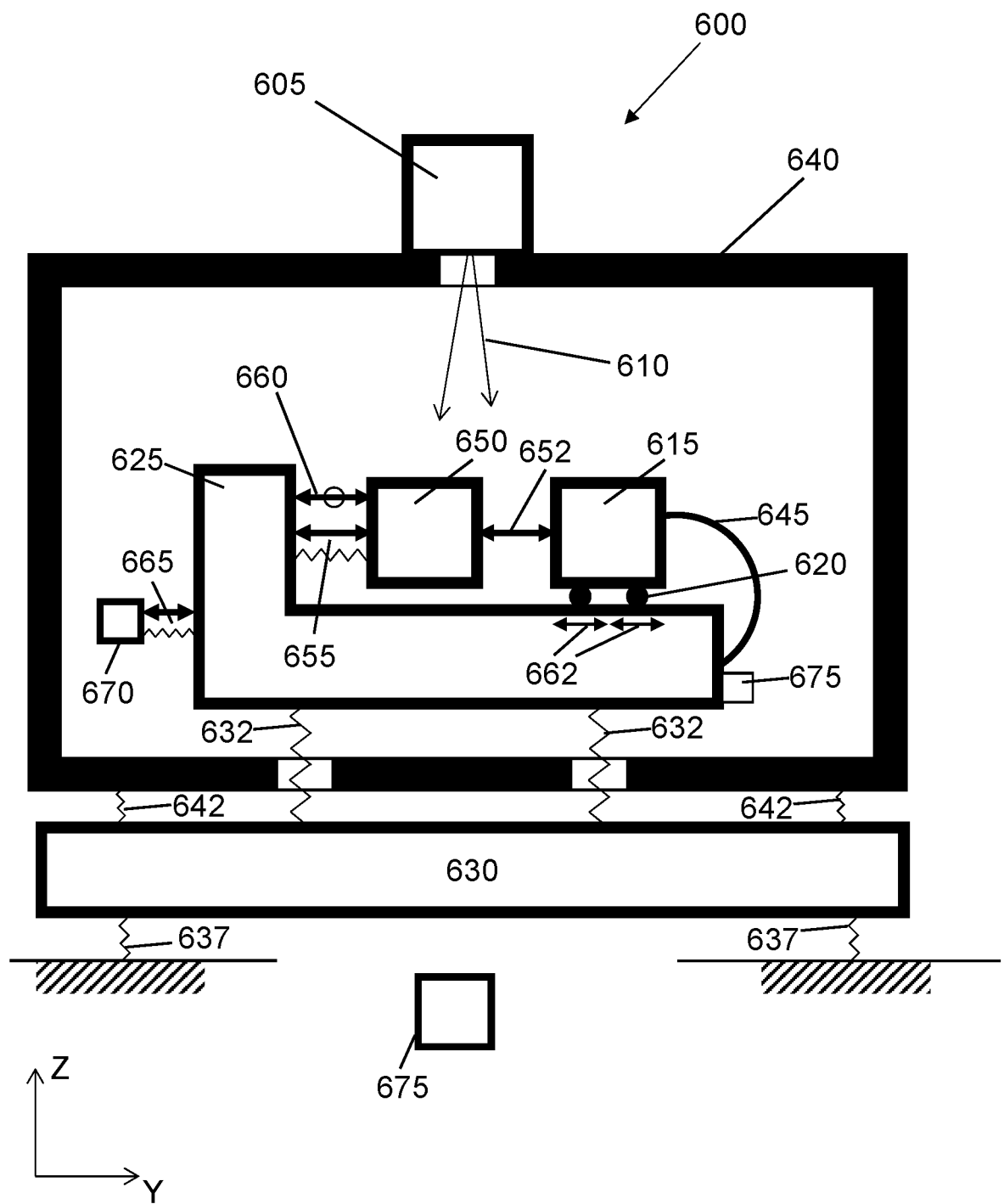
FIG. 7 schematically depicts a positioning device comprising a balance mass configuration as can be applied in a metrology or inspection apparatus according to an embodiment of the invention.

Referring to FIG. 7, an example of part of an inspection apparatus 600 is highly schematically depicted. The apparatus includes a SEM optical column 605 configured to provide one or more electron beams 610 onto an object (such as a semiconductor substrate) supported by a movable stage 615. In an embodiment, the stage has one or more actuators (e.g., linear electric motors) to move the stage 615. In an embodiment, the stage has a long-stroke (LoS) module to provide relatively long movements and a short-stroke (SS) module to provide relatively fine movements (although the positioning device need not be divided into LoS and SS functionality). While the movement in the Y direction is shown in FIG. 7, it will be appreciated that that one or more actuators of the stage 615 can also move the stage 615 in at least the X direction. In an embodiment, the stage may be driven by a planar motor arrangement such as described above. In this example, the stage 615 (or the LoS module of the stage 615) is guided by a bearing 620 between the stage 615 and a base structure 625. In an embodiment, the bearing 620 is a contact bearing, i.e., it makes physical between the stage 615 and the base structure 625, such as a roller bearing. The base structure 625 in this embodiment is supported on a pedestal 630 and has stiffness 632 indicating the limited stiffness of the base structure. The pedestal 630 in turn has stiffness 637 indicating the limited stiffness of the pedestal. Further, in this embodiment, the stage 615 and base structure 625 are within a vessel 640. In an embodiment, the vessel 640 is supported on the pedestal 630 and has a stiffness 642 indicating the limited stiffness of the vessel. Further, in an embodiment, a cable feed 645 is present between the stage 615 and the base structure 625 to feed, e.g., electric power to an actuator of stage 615. For simplicity, the vessel 640 is shown directly connected to the pedestal (floor) 630. However, in an embodiment, a base frame can be located between the pedestal 630 and the vessel 640.

Similar to embodiments described before, a balance mass 650 is provided to absorb reaction forces 652 arising from acceleration of stage 615 and accordingly movable. In an embodiment, the balance mass is supported by a suspension element that allows movement of the balance mass. In an embodiment, the suspension element is elastic to be able to make a predictable force for vibration suppression. In an embodiment, the suspension element is a flexible or elastic physical connection such as a leaf spring or a coil spring. In an embodiment, the suspension element is non-contact bearing, such as a gas or magnetic bearing.

The balance mass 650 acts to filter the reaction forces 652 from the base structure 625 and the remainder of the system; that is the balance mass 650 absorbs those reaction forces without leading them into the base structure 625 (and the rest of the system). In an embodiment, the balance mass 650 may comprises a single balance mass or multiple balance masses. For example, a single balance mass may be provided to absorb reaction forces in just one direction, e.g., X or Y direction, or to absorb reaction forces in more than one direction, e.g., X and Y directions. As another example, the balance mass 650 may comprise multiple balance masses such one balance mass for each reaction force direction such one balance mass to receive X direction actuation reaction forces and another balance mass to receive Y direction actuation reaction forces.

Ideally, the balance mass 650 moves in an opposite direction to the direction of acceleration of the stage 615 according to the mass ratio between the stage 615 (and associated one or more actuators) and the balance mass 650. In the ideal case, the balance mass absorbs all of the reaction forces. However, in reality, one or more disturbance and/or parasitic forces (e.g. due to elastic guiding) lead to less ideal behavior. Additionally or alternatively, there is a desire to avoid the need for an infinite balance mass stroke (when the balance mass drifts). Indeed, to reduce the balance mass stroke, typically a relatively large mass ratio of the mass of the balance mass 650 to the mass of the stage 615 (and associated one or more actuators) is applied, where the balance mass has a mass of, e.g., greater than or equal to 3 times, greater than or equal to 5 times, greater than or 10 times, etc., the mass of the stage 615 (and associated one or more actuators).

So, in an embodiment, the balance mass can be mounted with one or more springs/dampers (passive) and/or one or more actuators (active) to the base structure 625. The compensation by the balance mass will then no longer be ideal, but still the balance mass can absorb the majority of the stage 615 reaction forces.

Accordingly, in an embodiment, the balance mass position is actively controlled using an actuator 655 and a sensor 660. The purpose of the actuator 655 and sensor 660 is to control drift of the balance mass 650 and/or to compensate for one or more disturbance and/or parasitic forces disturbing ideal performance of the balance mass 650. In an embodiment, the sensor 660 can be configured to determine a characteristic of balance mass 650 corresponding to drift of the balance mass 650 (e.g., position) and/or to one or more disturbance and/or parasitic forces (and/or the effect of one or more disturbance and/or parasitic forces) disturbing ideal performance of the balance mass 650. In an embodiment, the sensor 660 can be configured to determine a position of the balance mass.

Having the measured value of a characteristic of balance mass 650 corresponding to drift of the balance mass 650 and/or to one or more disturbance and/or parasitic forces (and or their effects) disturbing ideal performance of the balance mass 650, a control system 675 for the actuator 655 can determine an appropriate signal for the actuator so that the actuator applies a force (which can be represented as $F_{BM}$) to reduce, minimize or eliminate the drift of the balance mass 650 and/or the one or more disturbance and/or parasitic forces (and or their effects) disturbing ideal performance of the balance mass 650. In an embodiment, the drift of the balance mass 650 and/or the one or more disturbance and/or parasitic forces (and or their effects) disturbing ideal performance of the balance mass 650 can be reduced by 50% or more, 75% or more, 85% or more, 90% or more, 95% or more, 98% or more, 99% or more, 99.5% or more or 99.9% or more.

So, forces used to drive the stage 615 are filtered by the balance mass and drift of the balance mass 650 from an expected position and/or one or more disturbance and/or parasitic forces (and or their effects) disturbing ideal performance of the balance mass 650, is controlled by the actuator 655 and the sensor 660.

But, while balance mass 650 absorbs most, if not all, of the reaction forces 652 arising from acceleration of stage 615, various other miscellaneous forces and/or torques (or more generally disturbances) are not filtered by the balance mass 650. As a non-limiting example, friction forces 662 of the bearing 620 are not filtered by the balance mass and can excite the base structure 625 directly. As a further non-limiting example, forces arising from movement of the cable feed 645 are not filtered by the balance mass and can excite the base structure 625 directly. One or more of these or other forces excite the base structure 625 directly, which in turn excite the SEM optical column 605. Excitation (e.g., vibrations, displacement, etc.) of the SEM optical column 605 can lead to, for example, undesired image distortion.

So, although the balance mass 650 filters reaction forces arising from the forces used to move the stage 615, one or more various disturbances (for example, forces between the stage 615 and the base structure 625 such as bearing friction forces 662 and/or cable feed 645 forces) directly excite the base structure 625. These one or more disturbances can lead to excitation of the SEM optical column 605 via the stiffness of mechanical feedthroughs and/or mounts (e.g., gas mounts, such as air mounts). Such excitation can lead to, for example, poor measurement results arising from, e.g., a deteriorated measurement image. For example, transmitted forces through bearings 620 in the form of roller bearings may increase a point-of-interest (POI) measurement error by approximately a factor 2.5 (without accounting for, e.g., forces through a cable feed 645 which are expected to lead to further increased POI measurement error. That is, a POI measurement error specification may be ~0.5 nm, which means the performance level of a system as described above without any friction could be satisfactory, but with friction the performance may be a factor 2.5 times out of specification.

Accordingly, to help reduce or remove such one or more base structure 625 disturbances (or their effects such as vibrations), an actuator similar to the actuator represented by force F1 described above in respect to FIG. 3 can be used to apply a compensating force to the base structure 625. An example of such an actuator is actuator 665, which applies a force to base structure 625 to compensate for one or more disturbances (or their effects) acting on the base structure 625. Like actuator represented by force F1 described above having, in an embodiment, a reaction mass 380, the actuator 665 can have a reaction mass 670 to absorb reactions forces of the actuator 665. Like balance mass 650, the reaction mass 670 can be supported by a suspension element, such as any of those identified above for the balance mass 650. The actuator 665 may be characterized as an inertial actuator. A compensation force applied by an actuator to reduce, minimize or eliminate one or more disturbances of the base structure 625 can be represented as $F_{IA}$.

To help determine the one or more disturbances (or their effects) acting on the base structure 625, a sensor 675 can be used to measure a value of a characteristic of base structure 625 corresponding to the one or more disturbances (or their effects) acting on the base structure 625. The output from such a sensor 675 can be represented as $\ddot{x}_{BP}$. In an embodiment, sensor 675 can be configured as a sensor to measure vibrations. In an embodiment, sensor 675 can be an accelerometer. As will be appreciated, the sensor 675 can determine one or more other types of characteristics corresponding to the one or more disturbances (or their effects) acting on the base structure 625, such as position and/or velocity. In an embodiment, the sensor 675 can be a geophone, a position sensor, a velocity sensor, piezo sensor, etc.

Having the measured value of a characteristic of base structure 625 corresponding to the one or more disturbances (or their effects) acting on the base structure 625, a control system 675 for the inertial actuator can determine an appropriate signal for the actuator 665 so that the inertial actuator applies a force $F_{IA}$ to reduce, minimize or eliminate the one or more disturbances (or their effects) acting on the base structure 625. In an embodiment, the one or more disturbances (or their effects) acting on the base structure 625 can be reduced by 50% or more, 75% or more, 85% or more, 90% or more, 95% or more, 98% or more, 99% or more, 99.5% or more or 99.9% or more.

So, the inertial actuator can achieve additional damping. So, in an embodiment, on the system level, disturbance forces leading to vibrations are damped, which can lead to improved measurements such as through improved image quality.

Now, while the above arrangement described in respect to FIG. 7 above can be effective to reduce, minimize or eliminate the one or more disturbances (or their effects) acting on the base structure 625, the arrangement of FIG. 7 can be greatly simplified and yet reduce, minimize or eliminate the one or more disturbances (or their effects) acting on the base structure 625. To that end, in an embodiment, the actuator 655 can be used to reduce, minimize or eliminate the one or more disturbances (or their effects) acting on the base structure 625, while also controlling drift of the balance mass 650 and/or compensating for one or more disturbance and/or parasitic forces disturbing ideal performance of the balance mass 650. Similarly, in an embodiment, the balance mass 650 and reaction mass 670 can be effectively combined into balance mass 650.

Figure 8:
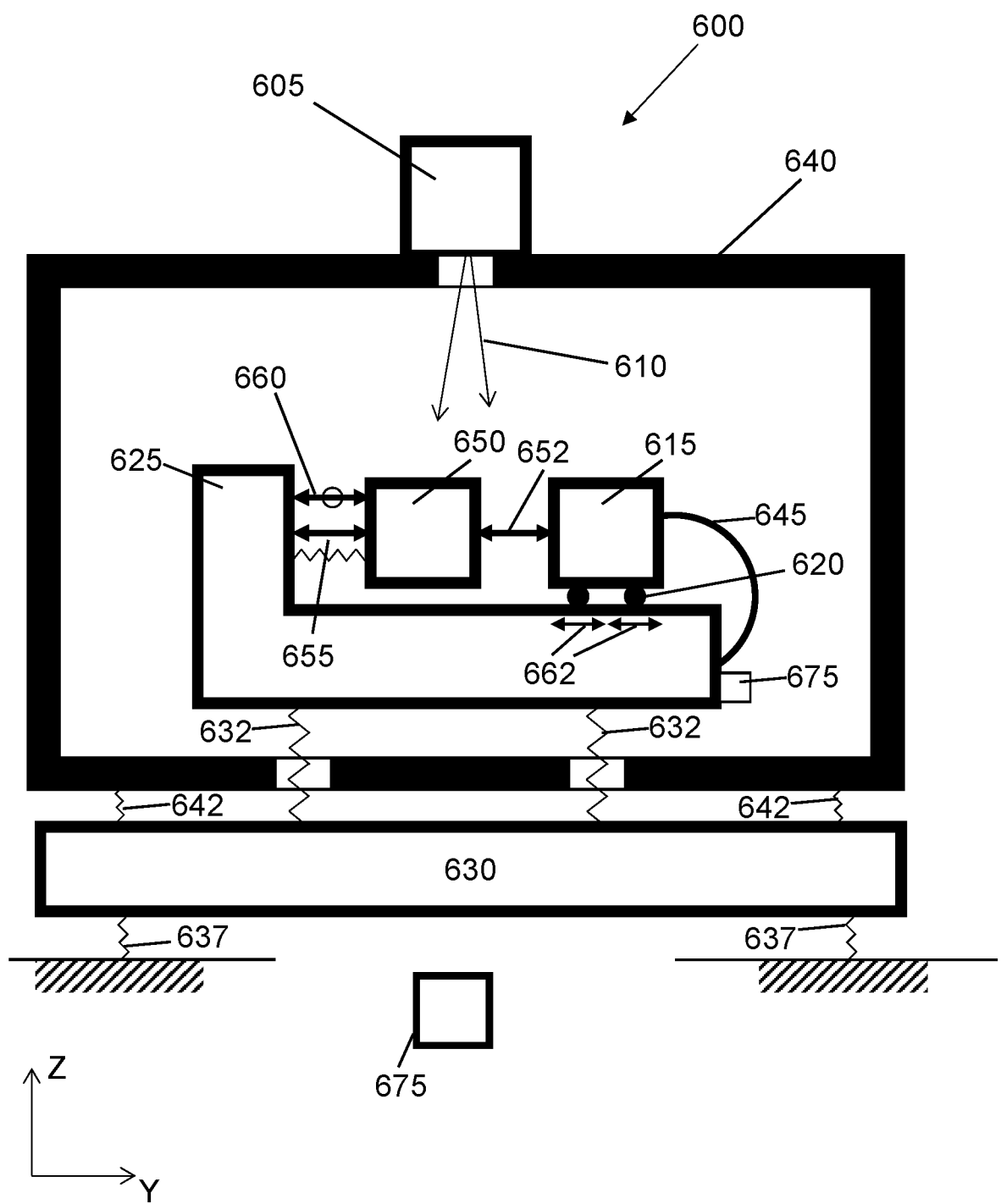
FIG. 8 schematically depicts a positioning device comprising a balance mass configuration as can be applied in a metrology or inspection apparatus according to an embodiment of the invention.

An embodiment of such an arrangement is highly schematically depicted in FIG. 8. The arrangement of FIG. 8 is essentially the same as FIG. 7, except that the actuator 665 and reaction mass 670 are no longer needed. As noted above, the function of the actuator 665 (and optionally the reaction mass 670) are incorporated into the function of balance mass 650 and the actuator 655. This combination of the function of the actuator 665 into the function of balance mass 650 and the actuator 655 can be referred to as an inertial balance mass. In this embodiment, actuator 655 is capable of applying a force to both the balance mass 650 and the base structure 625. For example, the actuator 655 comprises a linear motor capable of moving in the positive direction and the opposite negative direction, e.g., +X direction and −X direction. As another example, the actuator 655 comprises two reluctance motors, wherein one is capable of moving in the positive direction, e.g., +X direction, and the other is capable of moving in the opposite negative direction, e.g., −X direction.

Figure 9:
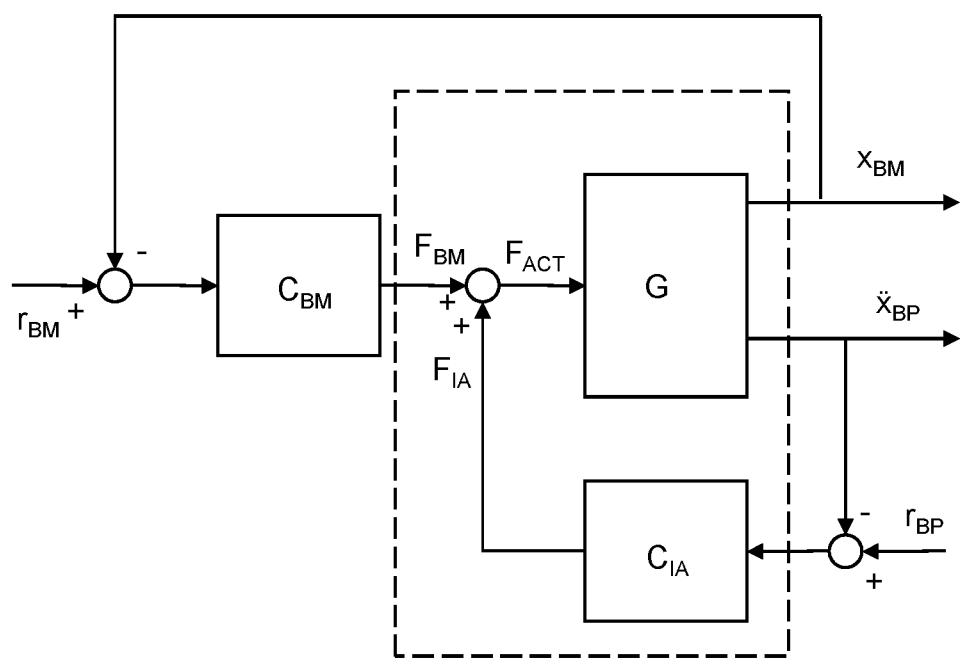
FIG. 9 depicts a control diagram for a positioning device comprising a balance mass configuration according to an embodiment of the invention.

To enable this combination, a particular control scheme of control system 675 is used. An embodiment of such a control scheme is depicted in FIG. 9. In this embodiment, a double control loop is used based on two different sensors signals. The first sensor signal is a signal $x_{BM}$ from sensor 660 and the second sensor signal is a signal $\ddot{x}_{BP}$ from sensor 675. These sensor signals are provided to a control system to determine two signals for combination into a signal for the actuator 655 which signal can be configured to cause the actuator 655 to apply a force to the balance mass 650, to the base structure 625, or to both; thus, a combined actuator signal $F_{ACT}$ is the result of both control loops. In an embodiment, a first signal $F_{BM}$ of the two signals corresponds to a force that reduces, minimizes or eliminates drift of the balance mass 650 and/or reduces, minimizes or eliminates one or more disturbance and/or parasitic forces disturbing ideal performance of the balance mass 650. In an embodiment, a second signal $F_{IA}$ of the two signals corresponds to a force that reduces, minimizes or eliminates the one or more disturbances (or their effects) acting on the base structure 625. In an embodiment, this combined signal $F_{ACT}$ (which is the combination of signal $F_{BM}$ and signal $F_{IA}$) corresponds to a force to be applied by the actuator 655 to the balance mass that reduces, minimizes or eliminates the one or more disturbances (or their effects) acting on the base structure 625, while also controlling drift of the balance mass 650 and/or compensating for one or more disturbance and/or parasitic forces disturbing ideal performance of the balance mass 650.

Referring to FIG. 9, an input signal $r_{BM}$ corresponding to the balance mass is provided to the control system. In an embodiment, the input signal corresponds to an expected or set point position of the stage 615 multiplied or divided by the ratio of the mass of the balance mass 650 to the mass of the stage 615 (and its one or more actuators). Thus, the input signal corresponds an expected position of the balance mass 650 in an ideal situation due to the reaction force from the stage 615 if the stage 615 is driven to its desired set point position. In this embodiment, reference is made to an input signal in the form of a position but as will be appreciated the input signal can represent different characteristics.

The input signal $r_{BM}$ is compared to a first sensor signal $x_{BM}$ from sensor 660, which represents a characteristic of balance mass 650 corresponding to drift of the balance mass 650 (e.g., position) and/or to one or more disturbance and/or parasitic forces (and or their effects) disturbing ideal performance of the balance mass 650. In this example, where the input signal $r_{BM}$ is a position, the first sensor signal $x_{BM}$ is a position of the balance mass 650 as measured by sensor 660. Thus, the input to a control system $C_{BM}$ is a difference between the input signal $r_{BM}$ and the first sensor signal $x_{BM}$, which is the drift of the balance mass from its expected position. The control system $C_{BM}$ converts its input into a signal $F_{BM}$ corresponding to a force to reduce, minimize or eliminate drift of the balance mass 650 (and/or a force to reduce, minimize or eliminate one or more disturbance and/or parasitic forces disturbing ideal performance of the balance mass 650 if the input signal $r_{BM}$ and the first sensor signal $x_{BM}$ correspond to such one or more disturbance and/or parasitic forces).

In another control loop (referred to as an inertial control loop), a second sensor signal $\ddot{x}_{BP}$ from sensor 675, which signal represents a characteristic of base structure 625 corresponding to one or more disturbances (or their effects) acting on the base structure 625, is combined with an input signal $r_{BP}$ corresponding to a desired condition for the base structure 625. For example, in an embodiment, the desired condition comprises a zero value of the measured characteristic of base structure 625 corresponding to one or more disturbances (or their effects) acting on the base structure 625. For example, the input signal $r_{BP}$ represents zero vibrations, zero acceleration, etc. Thus, the input to a control system $C_{IA}$ is a difference between the input signal $r_{BP}$ and the second sensor signal $\ddot{x}_{BP}$, which then represents the variance of the measured characteristic of base structure 625 corresponding to one or more disturbances (or their effects) acting on the base structure 625 from a desired such value as represented by the input signal $r_{BP}$. The control system $C_{IA}$ converts its input into a signal $F_{IA}$ corresponding to a force to reduce, minimize or eliminate the one or more disturbances (or their effects) acting on the base structure 625.

Then, as shown in FIG. 9, the first signal $F_{BM}$ is combined with the second signal $F_{IA}$ to yield the combined signal $F_{ACT}$, wherein the combined signal $F_{ACT}$ corresponds to a force to be applied by the actuator 655 to the balance mass 650 that reduces, minimizes or eliminates the one or more disturbances (or their effects) acting on the base structure 625, while also controlling drift of the balance mass 650 and/or compensating for one or more disturbance and/or parasitic forces disturbing ideal performance of the balance mass 650. The combined signal $F_{ACT}$ is then applied to the actuator 655 to apply a force to the balance mass 650 and/or base structure 625. Once the combined signal $F_{ACT}$ is applied, the first sensor signal $x_{BM}$ and the second sensor signal $\ddot{x}_{BP}$ are measured again such that the control loop can continue to reduce, minimize or eliminate the one or more disturbances (or their effects) acting on the base structure 625, while also controlling drift of the balance mass 650 and/or compensating for one or more disturbance and/or parasitic forces disturbing ideal performance of the balance mass 650.

So, a combined signal $F_{ACT}$ is provided to the balance mass plant G (which includes the balance mass 650, the actuator 655, the sensor 660 and the sensor 675) to apply a force to the balance mass 650 and/or the base structure 625. The dashed box in FIG. 9 thus indicates the equivalent plant observed by the balance mass control loop after closing the inertial control loop. So, in an embodiment, the dashed box around the plant G has the balance mass actuator force signal $F_{BM}$ as input and the measured balance mass position signal $x_{BM}$ and the measured base structure vibration or acceleration signal $\ddot{x}_{BP}$ as outputs, which essentially defines the plant for the system of FIG. 7. But, here an inner loop using inertial control system $C_{IA}$ is closed, resulting in a new plant as shown inside the dashed box. So, with a relatively simple controller, a stable inner loop (which creates damping) can be achieved.

In an embodiment, there is a separation in frequency so that the control system $C_{IA}$ does not interfere with the control system $C_{BM}$. For example, the control system $C_{BM}$ has a relatively low bandwidth e.g. in the range of 0-10 Hz, in the range of 0-5 Hz, in the range of 0-2.5 Hz or in the range of 0-1 Hz, while the control system $C_{IA}$ damps at relatively high frequency (e.g., higher frequency than the control system $C_{BM}$ such as greater or equal to 15 Hz, greater than or equal to 20 Hz or greater than or equal to 50 Hz). In an embodiment, the balance mass plant dynamics are not altered near the desired bandwidth of ~1-3 Hz, while the base structure is damped by the inertial balance mass.

If the frequencies of the base structure disturbances and the balance mass drifts are closer to each other such that there may be a conflict between the control by control systems $C_{IA}$ and $C_{BM}$, one or more features can be implemented to help ensure stability and performance. For example, a high pass filter can be applied in the inertial loop and/or a low pass filter can be applied in the balance mass loop, to help avoid overlap between frequencies (e.g., by eliminating high frequency components of balance mass drift and/or low frequency components of base structure disturbances). As further example, the input signal for the balance mass loop can be adapted to help avoid conflict between controller actions of control system $C_{IA}$ and control system $C_{BM}$ such as by applying an offset from a set point determined based on the stage 615 set point and the mass ratio.

Whether using reaction mass 670 with actuator 665 and/or the balance mass 650 with actuator 660, a force that is desired to be applied to the base structure 625 should be above the respective suspension frequency of the reaction mass 670 and/or the balance mass 650. Below this frequency, the applied force will essentially only deform the associated suspension element (e.g., the leaf spring) of reaction mass 670 and/or balance mass 650 with little or no resulting force on the base structure 625. Therefore, the applicable suspension frequency should be well below the frequencies desired to be damped in the base structure 625. For example, the suspension frequency is 30% or more less, 50% or more less, 75% or more less, or 90% or more less.

In an embodiment, the sensor 675 can be used in disturbance modelling and an associated compensation strategy. For example, where a friction force is put on the stage 615 and the balance mass 650 (e.g., a friction force between the stage 615 and the base structure 625), the reaction forces in the stage and balance mass system should cancel each other if the model of that system is accurate. For example, the appropriate signal can be given to the actuator 655 such that the balance mass doesn't drift. However, it can be that the balance mass still drifts or that a disturbance still occurs (e.g., in the base structure 625). For example, the coefficient of friction can change or a certain movement can excite a certain resonance mode. Accordingly, the output from the sensor 675 can be used to improve the modelling and reduce the mismatch. For example, a feedforward signal can be provided to the balance mass control system to enable correction of an expected mismatch.

In an embodiment, the inertial balance mass system can be used to improve the dynamics, and therefore measurement quality, based on measurement result analysis. In particular, an analysis can be performed to identify which one or more dynamics influence the measurement results and then based on those identified one or more dynamics, a manual tuning and/or an automated calibration can be performed to enable the inertial balance mass system to compensate for those one or more dynamics. For example, a feedforward signal can be provided to the balance mass control system to enable correction of one or more expected dynamics. To enable identification of one or more dynamics, the measurement results obtained without the inertial balance mass suppression of disturbances can be compared to measurement results obtained with the inertial balance mass suppression to identify any uncompensated one or more dynamics.

In an embodiment, the inertial balance mass system can be fine-tuned or calibrated per use case or measurement recipe type (e.g. where the measurement recipe defines one or measurement settings for a particular measurement sequence such as random defect inspection, systematic defect inspection, EUV mask print check, etc.). Each such use case or measurement recipe can have its own configuration of one or more settings of control system $C_{IA}$ and/or of control system $C_{BM}$.

So, in an embodiment, there is provided an inertial balance mass system that combines into a balance mass the combined functionality of filtering (reducing) stage reaction forces from reaching a base structure and suppressing disturbances (e.g., vibrations) of the base structure. In an embodiment, an existing balance mass can then be used to simultaneously absorb reaction forces from actuation of a stage and damp base structure vibrations. By adding a sensor (e.g., an acceleration sensor) and an inertial controller (e.g., in the form of software), a balance mass can function as inertial actuator (damper) in addition to an absorber of reaction forces from actuation of, e.g., a stage. In an embodiment, the inertial balance mass system is applied to a stage of an apparatus, such as a stage of a stand-alone measurement system, or a stage of a lithographic apparatus (such as a stage to hold a substrate for exposure), or a stage of a measurement system of another apparatus, such as measurement system of a lithographic apparatus, to enable improved measurement results (such as improved measurement images from, e.g., electromagnetic or electron beam imaging).

In an embodiment, the inertial balance mass system can provide improved measurement results, such as improved measurement image quality, due to reduced base structure vibrations. Improved image quality obtained using the inertial balance mass system can also lead to increased throughput as shorter measurement times may be realized when there is less vibrations.

In an embodiment, the inertial balance mass system can take advantage of mostly existing hardware (such as an existing balance mass and actuator of a balance mass system). No additional balance mass or balance mass actuator may be required. Moreover, the mass of an existing balance mass may not need to be increased since the base structure disturbances can be compensated by mostly small forces applied to the balance mass. Accordingly, the inertial balance mass system can be cost-effective compared to, e.g., using a separate actuator to compensate for base structure disturbances.

In an embodiment, the sensor to measure the base structure can be used for other purposes, such as diagnostics, model improvement, dynamics suppression, etc.

In an embodiment, the inertial balance mass system can be applied to any system with a balance mass to improve performance (such as measurement performance, image quality, etc.) and/or to improve throughput (e.g., improve the number of objects, such as substrates, processed per unit time, improve the number of measurements per unit time, etc.)

In an embodiment, one or more balance masses 650 are arranged to enable damping of vibration modes in one or more dimensions, two or more dimensions, three or more dimension, or up to six dimensions. For example, one or more balance masses can be provided to damp vibration modes in at least X, Y and Rz dimension. In an embodiment, multiple balance masses can be provided for one dimension, such as two balance masses that both move essentially exclusively in the Y dimension.

Furthermore, in an embodiment, a vibration mode in a particular dimension can be controlled by one or more balances masses moving in a different dimension. For example, by controlling individual balance masses in one or more dimension, a vibration mode in another dimension can be controlled such as by giving two balance masses that move in the Y dimension a different setpoint. Through the appropriate configuration of one or more balance masses, the effects of external disturbances (such as floor vibrations, bearing friction, etc.) that can cause base structure vibrations can be rejected or reduced.

While embodiments of FIGS. 8 and 9 are described primarily in terms of one or more linear motors to move stage 615, the one or more actuators to move stage 615 need not be so limited. For example, a single actuator for stage 615 can apply forces in more than one dimension, such as a planar motor.

While embodiments of FIGS. 8 and 9 are described primarily in terms of one or more contactless motors such as one or more linear or planar electric motors, the one or more actuators for the stage 615 need not be so limited.

Further, while embodiments of FIGS. 8 and 9 are primarily described in terms of stage 615 supported by a contact bearing, the stage 615 need not be supported by a contact bearing and can be supported, e.g., by a contactless bearing such as a gas or magnetic bearing. Similarly, the balance mass 650 can be supported by a different arrangement than a leaf spring.

Also, while embodiments of FIGS. 8 and 9 are described in terms of one or more 1D balance masses 650, a single balance mass 650 can be used to accept forces (e.g., a reaction force and/or a base structure vibration compensation force) from more than one dimension. For example, a single balance mass 650 can move in X and Y directions and thus absorb a reaction force in X and/or Y directions. A single balance mass can accept forces in more than two dimensions. Further, a balance mass 650 can accept reaction forces in a particular dimension but compensate for base structure vibrations in another dimension.

While, in the embodiment of FIG. 8, the actuator 665 and reaction mass 670 are no longer needed, the actuator 665 (and optionally the reaction mass 670) can be used in combination with the control system that provides function of the actuator 665 into the function of balance mass 650 and the actuator 655. For example, the control system that provides function of the actuator 665 into the function of balance mass 650 and the actuator 655 can be used when the disturbance frequencies of the base structure 625 and the balance mass 650 do not overlap and the actuator 665 (and optionally the reaction mass 670) can be used when the disturbance frequencies of the base structure 625 and the balance mass 650 overlap.

Further, while the disclosure above has focused on correcting for, e.g., unfiltered friction forces and/or cable feed forces that excite the base structure 625, the inertial balance mass system can compensate for one or more other disturbances (e.g., one or more disturbances other than that arising from friction and/or cable feed force) or for one or more additional disturbances (e.g., one or more disturbances in addition to that arising from friction and/or cable feed force such as one or more torques).

While embodiments of FIGS. 8 and 9 are described in terms of a single stage 615, it will be appreciated that the description herein can extend to one or more further stages, including one or more stages that do not support an object for measurement and/or exposure. Moreover, the one or more balance masses 650 can be shared among more than one stage.

While embodiments of FIGS. 8 and 9 are described in terms of a metrology or inspection apparatus, an embodiment of FIGS. 8 and 9 can be applied to a lithographic apparatus or to any system with a movable structure and a balance mass. So, while embodiments described throughout this disclosure are described mostly in the terms of a lithographic apparatus and/or a metrology or inspection apparatus, an embodiment of the invention can be applied to any system with a movable structure and a balance mass.

References herein to combinations of signals can include addition of the signals but is not limited to addition. Signals can be combined using other operations than merely addition to produce a resulting signal based on two or more input signals.

According to an aspect, there is provided a lithographic apparatus comprising: a base frame; an illumination system configured to condition a radiation beam and supported by the base frame; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; a positioning device configured to position the substrate table, the positioning device being supported by the base frame; the apparatus further comprising: a sensor configured to sense a vibration caused by a torque exerted on the base frame and, an actuator configured to exert a force on the illumination system or the base frame, in response to the sensed vibration, in order to at least partly dampen the vibration.

In an embodiment, there is provided a lithographic apparatus comprising: a base frame; an illumination system configured to condition a radiation beam and supported by the base frame; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; a positioning device configured to position the substrate table, the positioning device being supported by the base frame; a sensor configured to sense a vibration caused by a torque exerted on the base frame; and an actuator configured to exert a force on the illumination system or the base frame, in response to the sensed vibration, in order to at least partly dampen the vibration.

In an embodiment, the positioning device has a balance mass configuration, the torque being caused by the balance mass configuration. In an embodiment, the sensor is substantially arranged in line with the force exerted by the actuator. In an embodiment, the actuator and the sensor are substantially co-located. In an embodiment, the actuator comprises a first member mounted to the illumination system and a second member that is freely suspended and configured as a reaction mass. In an embodiment, the first member of the actuator is mounted to the illumination system via an interface mass and a damping member. In an embodiment, the lithographic apparatus comprises a plurality of sensors configured to sense the vibration and a respective plurality of actuators configured to exert a force on the illumination system or base frame in response to the sensed vibration. In an embodiment, a balance mass of the balance mass configuration is configured as a reaction mass of the actuator. In an embodiment, the balance mass comprises a magnet plate of the positioning device, the magnet plate comprising a two-dimensional pattern of permanent magnets. In an embodiment, the balance mass comprises a coil assembly of the positioning device, the coil assembly comprising a two-dimensional pattern of coils. In an embodiment, wherein the actuator comprises a first actuator configured to exert a force in a first horizontal direction and a second actuator configured to exert a force in a second horizontal direction, the second horizontal direction being substantially perpendicular to the first horizontal direction. In an embodiment, the lithographic apparatus comprises a further positioning device configured to position the support, the further positioning device having a further balance mass configuration, and wherein a balance mass of the further balance mass configuration is configured as a reaction mass of the actuator. In an embodiment, the sensor is configured to sense vibrations caused by the torque, in a range of 5 to 30 Hz, or in a range of 10 to 20 Hz. In an embodiment, the actuator comprises an electromagnetic actuator such as a reluctance actuator or a permanent magnet actuator. In an embodiment, the lithographic apparatus further comprises a controller configured to receive a sensor signal from the sensor, process the sensor signal to derive an actuator control signal and output the actuator control signal to control the actuator. In an embodiment, a control loop of the controller comprises one or more filters such as a high pass or a low pass filter, to improve a stability of the control loop.

In an embodiment, there is provided a device manufacturing method comprising: conditioning a radiation beam using an illumination system that is supported by a base frame; imparting the radiation beam with a pattern in its cross-section to form a patterned radiation beam using a patterning device; projecting the patterned radiation beam onto a target portion of a substrate; positioning a substrate table holding the substrate using a positioning device supported by the base frame; sensing a vibration caused by a torque exerted on the base frame; and exerting a force, using an actuator, on the illumination system or the base frame, in response to the sensed vibration, in order to at least partly dampen the vibration.

In an embodiment, the torque is being caused by a balance mass configuration of the positioning device. In an embodiment, the sensor is substantially arranged in line with the force exerted by the actuator. In an embodiment, the actuator comprises a first member mounted to the illumination system and a second member that is freely suspended and configured as a reaction mass.

Although specific reference may be made in this text to the use of lithographic apparatus in the manufacture of devices such as ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable and as discussed above, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams. For example, in an embodiment, the inspection or metrology apparatus imparts a particle beam onto the object to be measured or inspected, where the particle beam may be an ion beam or an electron beam.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, an embodiment of the invention may take the form of a computer program containing one or more sequences of machine-readable instructions implementing one or more methods or parts thereof as disclosed herein, or a non-transitory data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A measurement or inspection apparatus comprising:
   a system configured to measure or inspect an object;
   a base structure;
   an object support constructed to hold the object, the object support movably supported on the base structure;
   a balance mass configured to absorb a reaction force arising from movement of the object support;
   an actuator connected to the balance mass and the base structure, the actuator configured to apply a force to the balance mass and the base structure;
   a sensor configured to produce a signal for a measured characteristic of the base structure corresponding to a disturbance, or its effect, acting on the base structure; and
   a control system configured to determine, based on at least the signal for the measured characteristic of the base structure, a signal for the actuator to apply a force to the base structure and/or the balance mass.

2. The apparatus of claim 1, further comprising a sensor configured to produce a signal for a measured characteristic of the balance mass corresponding to drift of the balance mass and/or corresponding to a disturbance and/or parasitic force (and/or the effect of one or more disturbance and/or parasitic forces) disturbing ideal performance of the balance mass and wherein the control system is configured to determine the signal for the actuator also based on the signal for the measured characteristic of the balance mass.

3. The apparatus of claim 2, wherein the control system is configured to receive a signal based on a set point for the balance mass, combine the signal based on the set point signal with the signal for the measured characteristic of the balance mass to produce a combined signal relating to the balance mass, and generate a signal relating to a force to apply to the balance mass based on the combined signal.

4. The apparatus of claim 3, wherein the control system is configured to generate a signal relating to a force to apply to the base structure based on the signal for the measured characteristic of the base structure and combine the signal relating to the force to apply to the base structure and the signal relating to the force to apply to the balance mass to produce the signal for the actuator.

5. The apparatus of claim 1, wherein the control system comprises a filter to avoid overlap of frequencies between the signal for the measured characteristic of the base structure and a signal for a measured physical characteristic of the balance mass.

6. The apparatus of claim 1, wherein the object support is supported on the base structure by a contact bearing.

7. The apparatus of claim 1, wherein the apparatus is an electron microscope type metrology apparatus to provide an electron beam onto the object in order to measure or inspect the object.

8. A measurement or inspection apparatus comprising:
   a system configured to measure or inspect an object;
   a base structure;
   an object support constructed to hold the object, the object support movably supported on the base structure;
   a balance mass configured to absorb a reaction force arising from movement of the object support;
   an actuator connected to the balance mass and the base structure, the actuator configured to apply a force to the balance mass and the base structure;
   a sensor configured to produce a first signal for a measured physical characteristic of the base structure;
   a sensor configured to produce a second signal for a measured physical characteristic of the balance mass; and
   a control system configured to determine, based on the first and second signals, a signal for the actuator to apply a force to the base structure and/or the balance mass.

9. The apparatus of claim 8, wherein the measured physical characteristic of the balance mass corresponds to drift of the balance mass and/or corresponds to a disturbance and/or parasitic force (and/or the effect of one or more disturbance and/or parasitic forces) disturbing ideal performance of the balance mass.

10. The apparatus of claim 8, wherein the control system is configured to receive a signal based on a set point signal for the balance mass, combine the signal based on the set point signal, with the second signal to produce a combined signal relating to the balance mass, and generate a signal relating to a force to apply to the balance mass based on the combined signal.

11. The apparatus of claim 10, wherein the control system is configured to generate a signal relating to a force to apply to the base structure based on the first signal and combine the signal relating to the force to apply to the base structure and the signal relating to the force to apply to the balance mass to produce the signal for the actuator.

12. The apparatus of claim 8, wherein the control system comprises a filter to avoid overlap between frequencies of the first signal and the second signal.

13. The apparatus of claim 8, wherein the object support is supported on the base structure by a contact bearing.

14. The apparatus of claim 8, wherein the system configured to measure or inspect the object comprises an electron microscope type measurement system.

15. A non-transitory computer readable medium comprising instructions that, upon execution by a computer system, are configured to cause the computer system to at least:
obtain a signal for a measured characteristic of a base structure of a measurement or inspection apparatus, the measured characteristic corresponding to a disturbance, or its effect, acting on the base structure, wherein the base structure movably supports an object support constructed to hold an object and the measurement or inspection apparatus comprises: a system configured to measure or inspect the object, a balance mass configured to absorb a reaction force arising from movement of the object support, and an actuator connected to the balance mass and the base structure and configured to apply a force to the balance mass and the base structure; and
determine, based on at least the signal for the measured characteristic of the base structure, a signal for the actuator to apply a force to the base structure and/or the balance mass.

16. The computer readable medium of claim 15, wherein the instructions are further configured to cause the computer system to obtain a signal for a measured characteristic of the balance mass corresponding to drift of the balance mass and/or corresponding to a disturbance and/or parasitic force (and/or the effect of one or more disturbance and/or parasitic forces) disturbing ideal performance of the balance mass and to determine the signal for the actuator also based on the'signal for the measured characteristic of the balance mass.

17. The computer readable medium of claim 16, wherein the instructions are further configured to cause the computer system to receive a signal based on a set point for the balance mass, to combine the signal based on the set point signal with the signal for the measured characteristic of the balance mass to produce a combined signal relating to the balance mass, and to generate a signal relating to a force to apply to the balance mass based on the combined signal.

18. The computer readable medium of claim 17, wherein the instructions are further configured to cause the computer system to generate a signal relating to a force to apply to the base structure based on the signal for the measured characteristic of the base structure and to combine the signal relating to the force to apply to the base Structure and the signal relating to the force to apply to the balance mass to produce the signal for the actuator.

19. The computer readable medium of claim 15, wherein the system configured to measure or inspect the object comprises an electron microscope type measurement system.

20. A measurement or inspection apparatus comprising:
a base frame;
a system configured to measure or inspect an object and comprising an illumination system configured to illuminate the object with a radiation beam;
a base structure;
an object support constructed to hold the object;
a positioning device configured to position the object support, the positioning device being supported by the base frame and comprising a balance mass configuration, the balance mass configuration comprising a balance mass movable relative to the object support and configured to receive a reaction force arising from movement of the object support by the positioning device;
a sensor configured to sense a vibration caused by a torque exerted on the base frame; and
an actuator configured to exert a force on the illumination system or the base frame, in response to the sensed vibration, in order to at least partly dampen the vibration.

* * * * *